United States Patent
Goldberg

(10) Patent No.: US 7,573,051 B2
(45) Date of Patent: Aug. 11, 2009

(54) ION BEAM GUIDE TUBE

(75) Inventor: Richard D. Goldberg, Boston, MA (US)

(73) Assignee: Applied Materials, Inc., Santa Clara, CA (US)

( * ) Notice: Subject to any disclaimer, the term of this patent is extended or adjusted under 35 U.S.C. 154(b) by 155 days.

(21) Appl. No.: 11/822,738

(22) Filed: Jul. 9, 2007

(65) Prior Publication Data

US 2008/0054193 A1    Mar. 6, 2008

Related U.S. Application Data

(60) Provisional application No. 60/830,117, filed on Jul. 12, 2006.

(51) Int. Cl.
  H01J 37/317    (2006.01)
  H01J 37/30    (2006.01)
(52) U.S. Cl. .............. 250/492.21; 250/427; 250/492.2; 250/492.3; 250/396 R
(58) Field of Classification Search ............ 250/492.21, 250/427, 492.2, 492.3, 396 R
See application file for complete search history.

(56) References Cited

U.S. PATENT DOCUMENTS

| | | | |
|---|---|---|---|
| 4,994,674 A | 2/1991 | Tamai et al. | |
| 5,148,034 A | 9/1992 | Koike | |
| 5,399,871 A | 3/1995 | Ito et al. | |
| 5,466,929 A | 11/1995 | Sakai et al. | |
| 5,903,009 A * | 5/1999 | Bernstein et al. | 250/492.21 |
| 5,909,031 A * | 6/1999 | Kellerman et al. | 250/492.21 |
| 5,969,366 A | 10/1999 | England et al. | |
| 6,101,536 A | 8/2000 | Kotani et al. | |
| 6,313,428 B1 * | 11/2001 | Chen et al. | 219/121.43 |
| 6,501,081 B1 | 12/2002 | Foad et al. | |
| 2004/0104657 A1 | 6/2004 | Kyek | |
| 2007/0228294 A1 * | 10/2007 | Ito et al. | 250/492.21 |

* cited by examiner

Primary Examiner—Nikita Wells
(74) Attorney, Agent, or Firm—Boult Wade & Tennant

(57) ABSTRACT

The present invention relates to a guide tube for an ion beam in an ion implanter located adjacent a semiconductor wafer. Such guide tubes are provided to confine charged particles used for wafer neutralisation during implantation. According to the invention, a guide tube comprises an axis, open ends to receive an ion beam along said axis, a tube wall substantially parallel with said axis, and at least one opening through the tube wall forming a gas conduction passage from inside to outside the guide tube, said passage having a length aligned at an acute angle to said guide tube axis and a minimum dimension transverse to said length such that a line of sight through the passage perpendicular to said guide tube axis is substantially occluded.

5 Claims, 3 Drawing Sheets

ION BEAM GUIDE TUBE

FIELD OF THE INVENTION

The present invention relates to ion implanters, and in particular to the guide tube for an ion beam in an ion implanter which is located in the implanter adjacent a semiconductor wafer being implanted. Such guide tubes are provided to confine charged particles used for wafer neutralisation during implantation.

BACKGROUND OF THE INVENTION

When ion implantation is used in the fabrication of semiconductor devices, a problem can arise due to the accumulation of electrical charge at insulated locations over the surface of the semiconductor wafer being implanted. Excessive electrical charge at the surface of the semiconductor wafer can cause damage to the delicate structures being formed in the wafer, and can also have an effect on the implant process itself, especially when implanting ions at low energies.

It is therefore usual practice to provide arrangements for neutralising charge build-up on the wafer surface during ion implantation. An arrangement for wafer neutralisation during implantation is disclosed in U.S. Pat. No. 5,399,871. A guide tube is located in front of the wafer and the ion beam is directed through the guide tube to the wafer during implanting. A plasma generator associated with the guide tube provides a source of low energy electrons to the interior of the guide tube. In the case of the usual positive ion beam, electrostatic charge which can build up on the surface of the wafer being implanted is positive. The low energy electrons within the guide tube are attracted to any sites of positive electrostatic charge build up on the wafer surface, which are then neutralised.

Further developments in relation to charge neutralising systems of the kind described above are disclosed in U.S. Pat. No. 6,101,536 and U.S. Pat. No. 6,501,081. The neutralisation system disclosed in these prior art documents is referred to in the art as a plasma flood system (PFS).

In order to implant ions at low energies, it is known to provide an ion implanter with an electrostatic deceleration lens located along the ion beam, downstream of the mass selection arrangement and just in front of the wafer neutralisation system. A problem can arise with this deceleration lens arrangement, if some of the ions in the ion beam passing through the deceleration lens are or become neutralised, before being decelerated to the required target energy for implantation. Such neutrals then travel on in the beam and are implanted in the wafer at energies above the required target energy. This is referred to as energy contamination. Steps are therefore taken in prior art devices to minimise the residual gas pressure within the vacuum chamber of the ion implanter, in the region of the deceleration lens and between the lens and the mass selection slit of the implanter. In this way, the probability of ions in the beam from the mass selection slit having an interaction with residual gas atoms and molecules, which could result in charge exchange and neutralisation of the beam ion, can be minimised. An example of a deceleration arrangement in an implanter is described in U.S. Pat. No. 5,969,366.

The entirety of the disclosures of U.S. Pat. No. 5,969,366, U.S. Pat. No. 6,101,536 and U.S. Pat. No. 6,501,081 are incorporate herein by reference.

SUMMARY OF THE INVENTION

The present invention provides a guide tube for an ion beam in an ion implanter, for location in the implanter adjacent a wafer being implanted, to confine charged particles used for wafer neutralisation during implantation, the guide tube having an axis, open ends to receive an ion beam along said axis, a tube wall substantially parallel with said axis, and at least one opening through the tube wall forming a gas conduction passage from inside to outside the guide tube, said passage having a length aligned at an acute angle to said guide tube axis and a minimum dimension transverse to said length such that a line of sight through the passage perpendicular to said guide tube axis is substantially occluded.

It has been found that the provision of one or more such passages through the wall of the guide tube of the wafer neutralisation arrangement, can substantially reduce the energy contamination in a decelerated ion beam using a deceleration lens located just upstream of the guide tube. It has been noted that outgassing photoresist from the wafer being implanted, and also the inert gas used in the plasma flood system, contribute to the residual gas pressure in the region of the deceleration lens. The provision of one or more passages through the side wall of the guide tube of the plasma flood system can allow both the outgassed material from the wafer, and the inert PFS gas (typically argon) to escape from the guide tube, and thereby reduce the contribution to residual gas pressure in the region of the deceleration lens. By making the passage or passages through the guide tube wall at an acute angle to the axis of the guide tube, and ensuring that the minimum transverse dimension of the passage is small enough, the electrostatic effect of the guide tube in confining the desired low energy electrons, is scarcely impaired. Furthermore, because the line of sight through the passage or passages perpendicular to the guide tube axis is substantially occluded, thermal loading on equipment in the vicinity of the guide tube, such as for example a cryo-pump, is well controlled.

The minimum transverse dimension of the passage through the wall of the guide tube may be in a plane containing the guide tube axis.

In one example the passage is formed as a slot through the tube wall having a major dimension transverse to the passage length, which is transverse to the guide tube axis.

In the case where the guide tube has a downstream end to be adjacent a wafer during implantation and an upstream end to receive the ion beam, the passage is preferably directed away from the downstream end. With this orientation material outgassing from the wafer during implantation can more readily pass through a passage to escape the interior of the guide tube.

BRIEF DESCRIPTION OF THE DRAWINGS

Examples of the invention will now be described with reference to the following drawings in which.

DETAILED DESCRIPTION OF THE PREFERRED EMBODIMENTS

Figure 1:
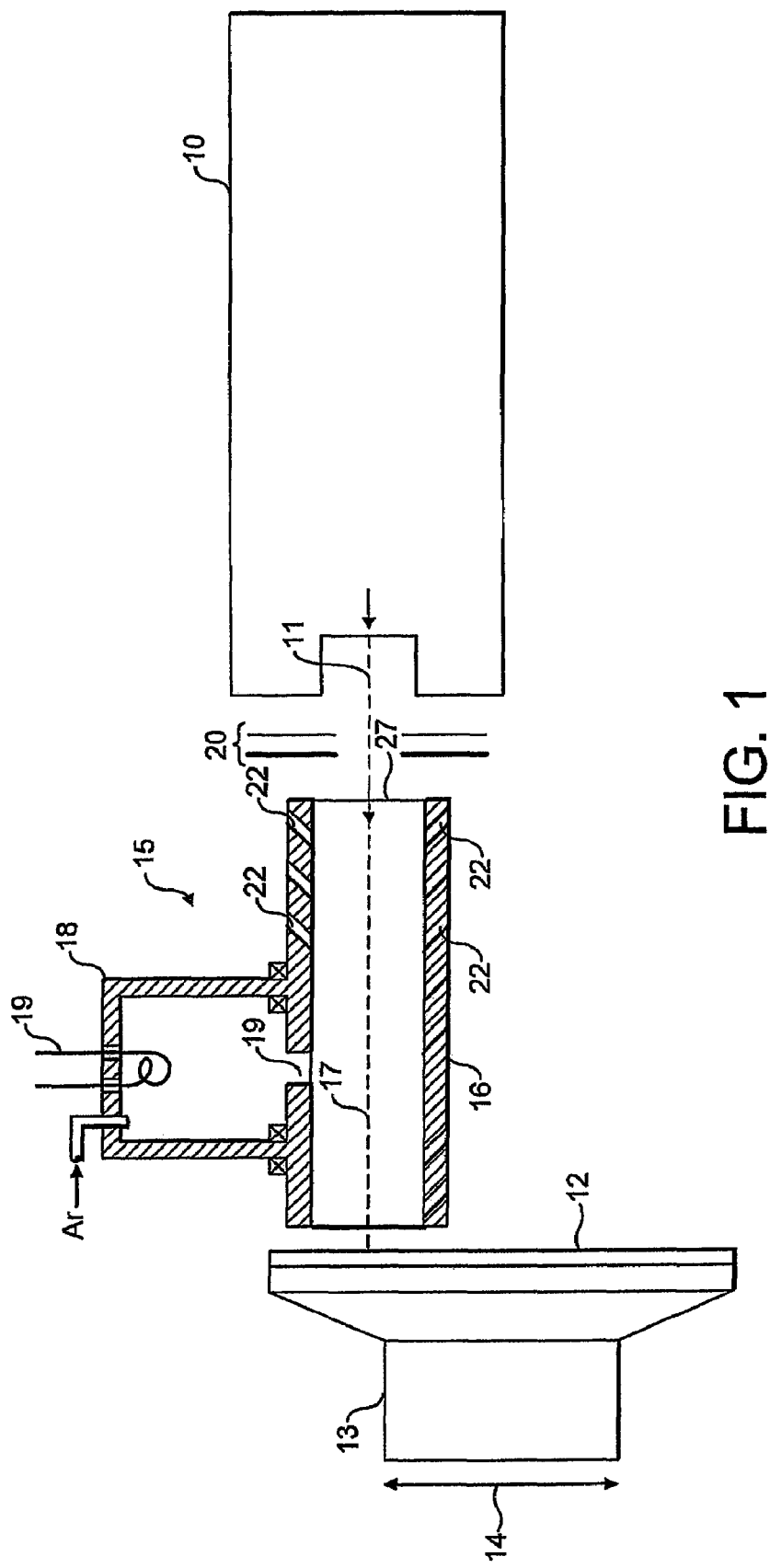
FIG. 1 is a simplified diagram of an ion implanter incorporating an embodiment of the present invention.

In FIG. 1, the illustrated ion implanter comprises an ion beam generator shown generally at 10. The ion beam generator 10 comprises an ion source, from which ions are extracted including ions of the species required for implantation, a mass selector, typically comprising a magnetic sector analyser and a mass selection slit. The mass selector ensures that essentially only ions of the desired species for implantation emerge through the mass selection slit in a beam towards the wafer for implantation. All the elements of the ion implanter forming the ion beam generator 10 are well known in this field and a typical arrangement known in the art is shown in the aforementioned U.S. Pat. No. 5,969,366.

The ion beam generator 10 produces a beam 11 of ions at a predetermined energy directed at a semiconductor wafer 12 mounted on a wafer holder 13. Typically, the cross-section or footprint of the ion beam as it strikes the wafer 12 to be implanted is much smaller than the area of the wafer. Therefore, in order to ensure that all parts of a wafer are dosed evenly with the required ions, the wafer holder 13 may be scanned, as illustrated by the arrows 14, so that all parts of the wafer 12 are equally exposed to the ion beam 11. The system for scanning the wafer 12 relative to the ion beam 11 may involve two-dimensional scanning of the wafer holder passed a fixed ion beam, two-dimensional scanning of the ion beam over a fixed wafer, or combinations of these in which the ion beam is scanned in one direction and the wafer is moved in another direction. All forms of mutual scanning of the wafer and ion beam are contemplated in the present invention, although the invention is particularly useful in cases where the ion beam is fixed and only the wafer is scanned.

Immediately in front of the wafer 12 the ion implanter has a wafer neutralisation system indicated at 15. The wafer neutralisation system is intended to provide low energy electrons in the region immediately in front of the wafer, so that these electrons can be attracted to any positively charged locations on the wafer, to prevent excess electric charge building up on the wafer and the possibility of damage resulting from this charge.

The wafer neutralisation system 15 comprises a guide tube 16 which is open at each end so that the ion beam 11 can pass through the guide tube 16 generally parallel to an axis 17 of the guide tube. A plasma chamber 18 is provided fixed to a wall of the guide tube 16. An interior of the plasma chamber 18 communicates with the interior of the guide tube 16 through an opening 19. An inert gas such as argon is supplied to the plasma chamber 18 and a plasma is formed by suitably biasing a heated cathode 19 relative to the walls of the plasma chamber 18. An abundance of electrons is produced in the plasma which can then emerge through the aperture 19 into the interior of the guide tube 16, for use in neutralising any charge build up on the wafer 12 during the implantation. Further details of a plasma flood system (PFS) of this type for neutralising a wafer during implantation, are given in the aforementioned U.S. Pat. No. 5,399,871, together with U.S. Pat. No. 6,101,536 and U.S. Pat. No. 6,501,081.

The guide tube 16 is effective to confine low energy electrons produced by the plasma chamber 18 within the interior of the guide tube, so that they are available for neutralising positive charge build up on the wafer 12. For this purpose the guide tube 16 may be held at a small negative potential.

Although a particular form of PFS type neutralising system has been described, any neutralising system can be used with embodiments of the invention, where the neutralising system employs a guide tube generally similar to guide tube 16, for the purpose of confining neutralising electrons around the ion beam and in front of the wafer being implanted.

Usually the energy of the mass selected beam of ions in an implanter is 10 keV or greater. Energies lower than this can be produced by the ion beam generator 10, but such low energy beams can be difficult to transport through the mass analyser within the generator 10, so that resulting low energy ion beams can have very low ion current. However, it is often required to implant ions at energies of 1 keV or less. Accordingly, a deceleration lens, shown generally at 20, may be located between the mass selection slit and the guide tube 16 of the wafer neutralising system 15.

The deceleration lens 20 comprises one or more electrodes biased to set up an electrostatic deceleration field in the region of the ion beam 11. The ion beam passing from the deceleration lens 20 into the guide tube 16 may thus be decelerated to a lower energy for implantation. A suitable deceleration lens structure is described in detail in the aforementioned U.S. Pat. No. 5,969,366.

If there are any neutral atoms in the beam 11, these neutrals are, of course, not decelerated by the deceleration field produced by the deceleration lens 20. Such neutrals may pass along the beam through the guide tube 16 at energies above the decelerated energy of the beam 17 and be implanted at this higher energy in the wafer 12. Such energy contamination of the wafer is undesirable and steps are taken to ensure that the number of neutrals in the region of the deceleration lens 20 is minimised.

It has been found that neutral contamination can be reduced by providing angled slots 22 through the walls of the guide tube 16.

Figure 2:
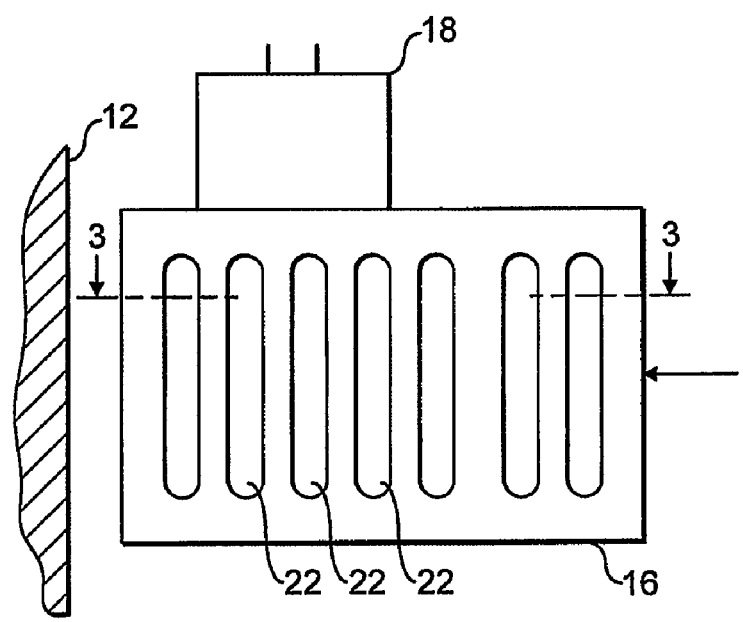
FIG. 2 is a schematic illustration of a wafer neutralisation system containing a guide tube embodying the present invention.
Figure 3:
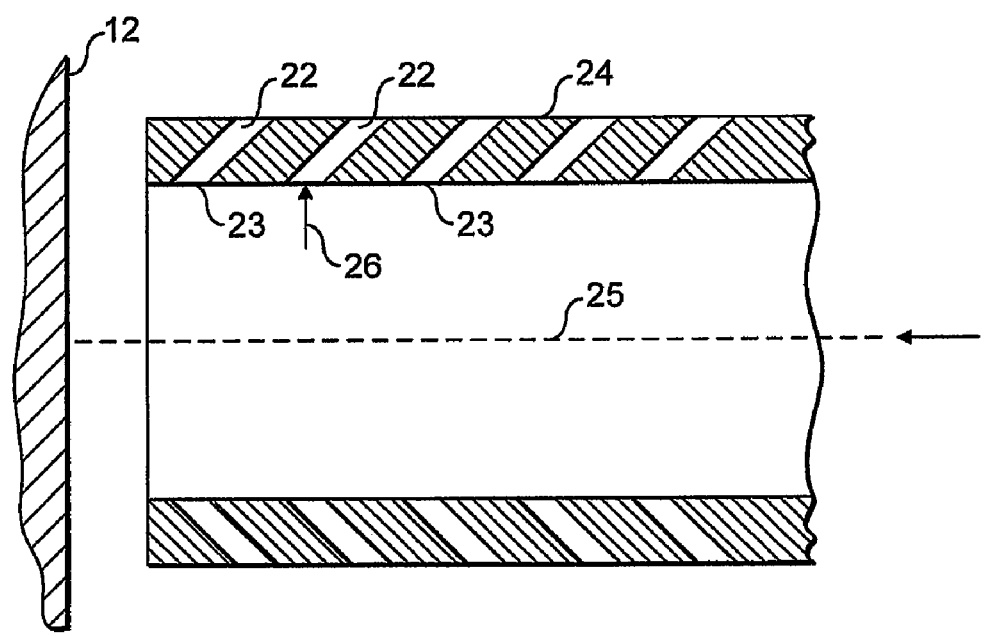
FIG. 3 is a cross-sectional view of the guide tube taken along line 3-3 in FIG. 2.

These slots 22 can be seen more easily in FIG. 2 which shows an expanded view of a guide tube 16, taken with the cross-sectional view of FIG. 3. As can be seen in FIGS. 2 and 3, slots 22 have a major dimension extending transverse to the direction of the axis of the guide tube 16.

In the present example, the guide tube 16 has essentially rectangular cross-section and the slots 22 illustrated in FIG. 2 are in one lateral wall of the guide tube. Similar slots will be provided in the opposed wall and further slots provided in the lower and upper walls which are shown in cross-section in FIG. 1. As seen in FIG. 3, which is a cross-sectional view taken along the line 3-3 of FIG. 2, the slots 22 comprise passages 23 extending through the thickness of the wall 24 of the guide tube. Each of the passages 23 has a length (extending between the interior and the exterior of the guide tube) which is aligned at an acute angle to the guide tube axis, shown as dotted line 25 in FIG. 3. Further, each of the passages 23 has a minimum dimension, which corresponds to the widths of the slots 22, which is sufficiently small so that there is no line of sight from the interior to the exterior of the guide tube in directions perpendicular to the axis 25 of the guide tube, as illustrated by arrow 26 in FIG. 3. Importantly, the passages 23 are angled in directions outwards and away from the wafer 12, at the left hand end of the guide tube as shown in FIG. 3. In this way, atoms and molecules outgassing from the wafer 12 during implantation (typically from the masking materials or resist applied to the wafer prior to an implantation process) can more readily escape from the interior of the guide tube 16 by passing through the passages 23. Angling the passages outwards and away from the surface of the wafer 12 allows resist gases to escape more easily.

Furthermore it will be appreciated that the feed of inert (argon) gas to the interior of the plasma chamber 18, can result in an elevated residual gas pressure from this source within the interior of the guide tube 16. The passages 23 also provide a conduction path for the escape of this PFS gas.

As a result, the amount of gas exiting the upstream end 27 of the guide tube (see FIG. 1) is reduced. This in turn, provides a reduced gas loading of the region of the deceleration lens 20. As a result, there is a reduced probability of ions in the beam 11 from the ion beam generator 10 being neutralised, by a collision event with a residual gas molecule, between emerging from the mass selection slit in the beam generator 10, and being fully decelerated by the deceleration lens 20. Consequently, energy contamination of the beam passing through the guide tube 16 to the wafer 12 for implantation is reduced.

Although the advantage of the slotted passages through the walls of the guide tube can be most significant for a decelerated beam, advantages are also obtained when used in an ion implanter with no deceleration lens 20, or when the deceleration lens 20 is not biased to decelerate the beam. Then, by reducing the residual gas pressure along the beam path following the mass selector, the number of neutrals produced in the beam can be reduced, so that the total current in the beam being implanted at any time can be measured more easily. It will be understood that a beam of charged ions can be measured quite easily by ensuring that the total charge delivered by the ion beam to a collecting device is monitored over time. However, neutral atoms or molecules are not measured, even though when these neutrals are implanted in the semiconductor, they have the same effect as the implantation of an ionised particle of the same species. Therefore, reducing the number of neutrals in the ion beam being implanted can be useful to improve the accuracy of dose measurement and control.

Slanting the passages 23 provided by the slots 22 through the guide tube wall has a number of advantages. Firstly, the passages are slanted away from the wafer 12 being implanted, so that outgassing material from the wafer can more readily pass along the passages 23 to the exterior of the guide tube. Secondly, by slanting the passages 23 and controlling the width of the slots 22, the radiation of heat from within the guide tube 16 can be reduced and controlled. This can be particularly important in preventing overloading of sensitive equipment in the process chamber surrounding the wafer and the neutralisation system 15, such as a cryo pump used for maintaining the vacuum in this region.

Thirdly, the acutely angled passages 23 prevent substantial distortion of the electrostatic field within the guide tube, required to confine low energy electrons for wafer neutralisation.

A further advantage can arise if there is a tendency for the interior of the guide tube to become coated, for example with outgassed resist material. Such coating may be dielectric and result in impairment of the electron confinement field produced by the guide tube 16. The passages 23, have a significant length between the interior and the exterior of the guide tube, which is increased as a result of the acute angle of the passages 23. The probability of at least some portions of the surface of the interior of the guide tube, including the interior walls of the passages 23, remaining free of insulating coating, is increased.

Figure 4:
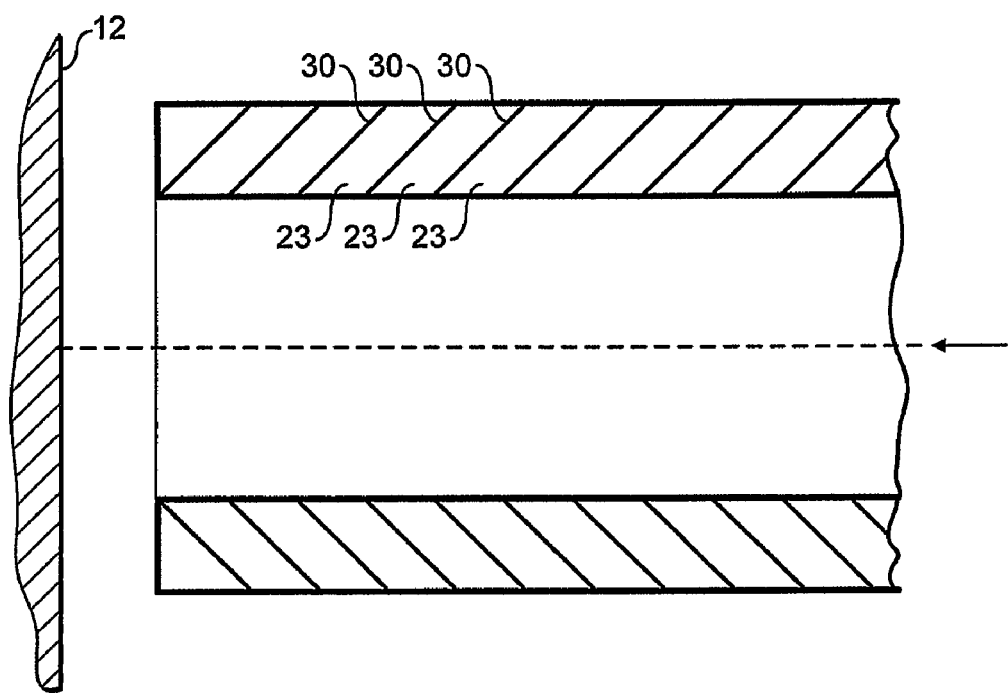
FIG. 4 illustrates a modified form of guide tube embodying the present invention.

FIG. 4 illustrates a different embodiment in which the walls of the guide tubes 16 comprise multiple angled slats 30 mounted between corner posts forming a framework for the guide tube. With this structure, the total open area of the passages 23, permitting outgassing materials and PFS gas to escape from the interior of the guide tube is maximised. The line of sight perpendicular to the axis of the guide tube is still occluded by the slats.

A further advantage of the angled passages is most evident with the angled slat arrangement. Beam ions striking the interior tubular walls of the guide tube can cause particles to be sputtered from the tube walls and thrown forward to contaminate the wafer surface. With acute angled passages in the shape of slots through the walls of the guide tube, the surface area of the guide tube walls which are generally parallel to the beam direction is reduced, so that this risk of sputtering contaminants onto the wafer is also reduced. In the case of the slatted walls illustrated in FIG. 4, the surface area of the guide tube parallel to the beam direction is minimised.

The invention claimed is:

1. A guide tube for an ion beam in an ion implanter, for location in the implanter adjacent a wafer being implanted to confine charged particles used for wafer neutralisation during implantation, the guide tube having an axis, open ends to receive an ion beam along said axis, a tube wall substantially parallel with said axis, and at least one opening through the tube wall forming a gas conduction passage from inside to outside the guide tube, said passage having a length aligned at an acute angle to said guide tube axis and a minimum dimension transverse to said length such that a line of sight through the passage perpendicular to said guide tube axis is substantially occluded.

2. A guide tube as claimed in claim 1, wherein said minimum transverse dimension of said passage is in a plane containing said guide tube axis.

3. A guide tube as claimed in claim 2, wherein said passage is formed as a slot through the tube wall having a major dimension transverse to the passage length, which is transverse to said guide tube axis.

4. A guide tube as claimed in claim 1, wherein the guide tube has a downstream end to be adjacent a wafer during implantation and an upstream end to receive the ion beam, and said passage is directed away from said downstream end.

5. An ion implanter having a guide tube as claimed in claim 1.

\* \* \* \* \*